US005426361A

United States Patent [19]

Simmons

[11] Patent Number: 5,426,361
[45] Date of Patent: Jun. 20, 1995

[54] ELECTRONIC RECONFIGURABLE INTERCONNECT SYSTEM

[76] Inventor: Selwyn D. Simmons, P.O. Box 18518, Los Angeles, Calif. 90018

[21] Appl. No.: 756,903

[22] Filed: Sep. 9, 1991

[51] Int. Cl.⁶ .............................................. G01R 31/02
[52] U.S. Cl. ................................ 324/158.1; 324/73.1
[58] Field of Search .............. 324/158 R, 158 F, 73.1, 324/500, 537, 538, 158.1, 754; 340/653; 371/22.1, 22.6, 15.1

[56] References Cited

U.S. PATENT DOCUMENTS

| | | | |
|---|---|---|---|
| 3,486,160 | 12/1969 | Wallace . | |
| 3,628,095 | 12/1971 | Schwartz et al. | 174/68.5 |
| 4,443,866 | 4/1984 | Burgiss | 364/900 |
| 4,617,728 | 10/1986 | Andersen et al. | 29/836 |
| 4,628,411 | 12/1986 | Balderes et al. | 361/414 |
| 4,670,749 | 6/1987 | Freeman | 340/825.85 |
| 4,691,972 | 9/1987 | Gordon | 439/77 |
| 4,704,551 | 11/1987 | Berger | 307/575 |
| 4,727,317 | 2/1988 | Oliver | 324/158 R |
| 4,730,159 | 3/1988 | Collins | 324/158 F |
| 4,734,980 | 4/1988 | Nakamura et al. | 174/68.5 |
| 4,758,745 | 7/1988 | Elgamal et al. | 307/465 |
| 4,764,925 | 8/1988 | Grimes et al. | 324/73.1 |
| 4,768,195 | 8/1988 | Stoner et al. | 324/73.1 |
| 4,779,043 | 10/1988 | Williamson, Jr. | 324/158 R |
| 4,779,340 | 10/1988 | Kilm et al. | 361/398 |
| 4,783,719 | 11/1988 | Jamieson et al. | 361/398 |
| 4,853,828 | 8/1989 | Penn | 361/386 |
| 4,864,219 | 9/1989 | Parsons | 340/653 |
| 4,868,980 | 9/1989 | Miller | 174/68.5 |
| 4,922,184 | 5/1990 | Rosenstein et al. | 324/158 F |
| 4,924,179 | 5/1990 | Sherman | 324/158 F |
| 5,061,895 | 10/1991 | Fong | 324/158 R |
| 5,068,604 | 11/1991 | Van de Lagemaat | 324/158 R |

*Primary Examiner*—Vinh Nguyen
*Attorney, Agent, or Firm*—Freilich Hornbaker Rosen

[57] ABSTRACT

A system and a method to establish reconfigurable electrical connections between selected leads of electronic devices includes a node board having a plurality of nodes into which the leads of the electronic devices are inserted, and a device proximity detector for locating the position of the electronic devices inserted in the node board, and a power controller containing a plurality of switches disposed to connect power and ground to selected nodes, and a connection array of switches for coupling combinations of nodes. The system and method determine the location of the electronic devices present on the node board using information from the device proximity detector about which leads are present and a board layout diagram. Devices are placed on the node board in the same relative positions as they appear on the board layout diagram and their locations are automatically determined and connections according to a schematic are automatically established.

12 Claims, 9 Drawing Sheets

ELECTRONIC RECONFIGURABLE INTERCONNECT SYSTEM

BACKGROUND OF THE INVENTION

1. Field of the Invention

This invention relates to the establishment of interconnect between electronic devices. Specifically, the invention deals with a system and a method for creating electrical connections between selected leads of electronic devices.

2. Description of the Related Art

Conventional methods of interconnecting electronic devices include the use of wire wrap boards, proto-boards, multi-wire boards, routed circuit boards and printed circuit boards. While generally suitable for its intended purposes, a wire wrap board limits the number of connections to any one node since a minimum length of wire must contact the wire wrap post to ensure electrical and mechanical integrity. Proto-boards are similar to wire wrap boards in that wires are used to create connections between devices. In the case of proto-boards, the wires are plugged into holes that are electrically parallel to the holes that contain the device leads. Proto-boards are fabricated by hand and are mechanically unstable making them expensive and cumbersome to implement and difficult to debug. Multi-wire boards are composed of a non-conducting surface into which electrical components are inserted. Individually insulated wires are connected to each point to which electrical continuity is desired. For a printed circuit board, as with a routed circuit board and a multi-wire board, electrical connections are difficult and expensive to modify. In addition, advanced technology devices with operating frequencies greater than 50 MHz do not function well using conventional connection technology.

Current approaches to providing electronic interconnect for electronic devices do not address the need for an interconnect architecture that is completely reconfigurable. For example, in the case of integrated circuit programmable cross-point switches, the interconnection capabilities are limited to on chip functions that result in a minimal number of possible configurations. Furthermore, these cross-point switches of the prior art are limited to the modification or customization of a single integrated circuit.

SUMMARY OF THE INVENTION

In accordance with the present invention reconfigurable electrical connections are established between selected leads of electronic devices. In a preferred embodiment, the system of the present invention comprises a computer, a node board, a connection array, a device proximity means and a power control means.

The computer provides a user interface and controls the system. It may comprise a high resolution screen, a central processing unit ("CPU"), a random access memory ("RAM"), a disk drive and operating system and control software. Alternatively, the computer may be part of a networked computer system, in which the aforementioned elements may be shared or present along with other computer systems in the network.

The node board contains an array of nodes for receiving the pins or leads of electronic devices. Each node is electrically independent and contains at least two electrically independent contacts which make electrical contact with the pins or leads of the electronic device. The node board also contains a metal tab at each node which provides a mechanical force capable of securing an inserted pin or lead and an attachment for connecting to a mechanical stabilizer assembly.

The connection array provides reconfigurable connections between selected pins or leads of electronic devices on the node board.

The device proximity means identifies locations of device pins or leads that have been inserted at node locations on the node board. The device proximity means comprises node selection circuitry and test and analysis circuitry. The device proximity means provides the information about the device lead locations to the computer which implements a proximity detection procedure to locate the devices present on the node board.

The power control means provides power and ground to selected leads of devices on the node board under control of the computer.

DESCRIPTION OF THE PREFERRED EMBODIMENT

Figure 1A:
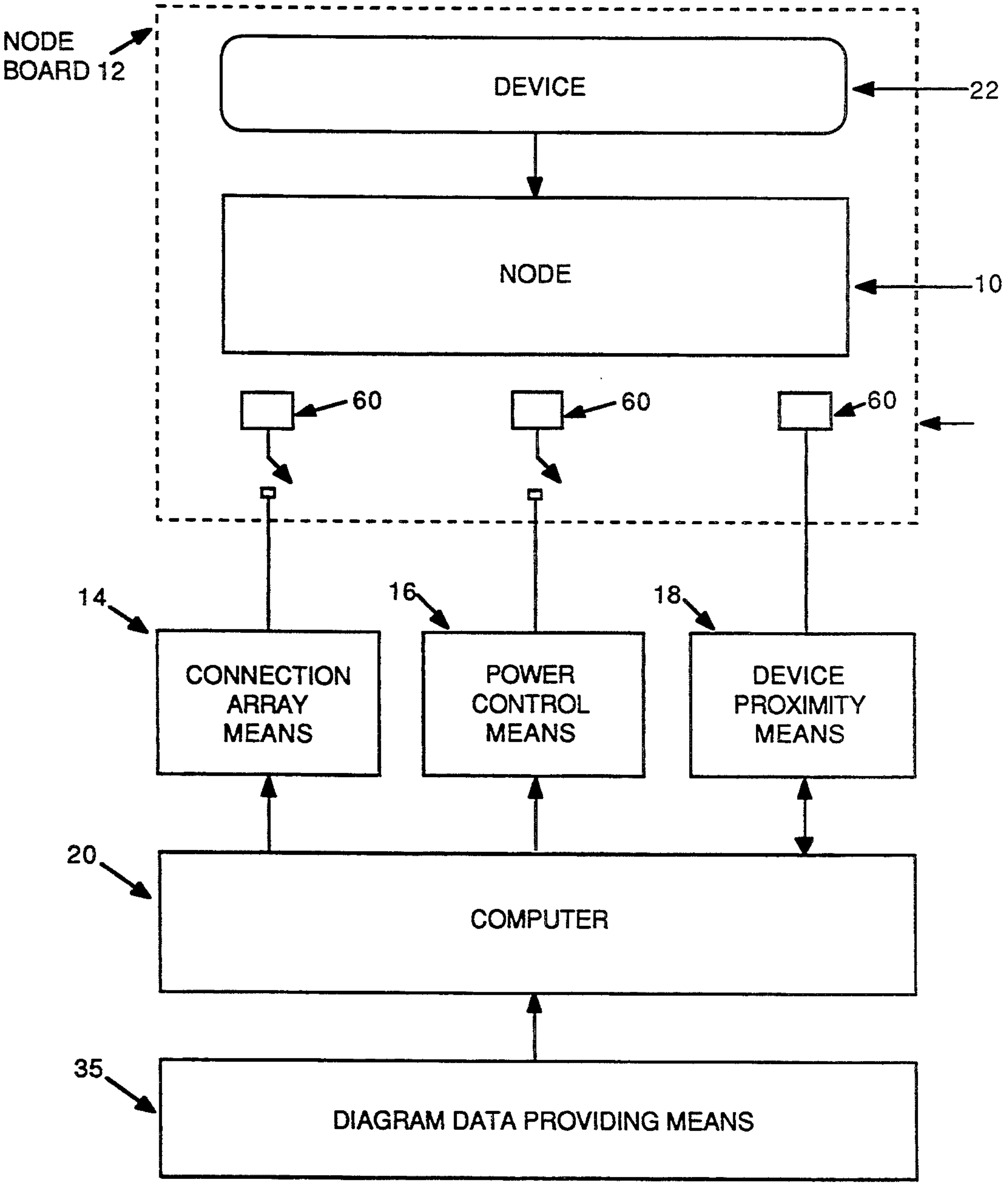
FIG. 1(A) is a block diagram of the system circuitry according to a preferred embodiment of the present invention.
Figure 2:
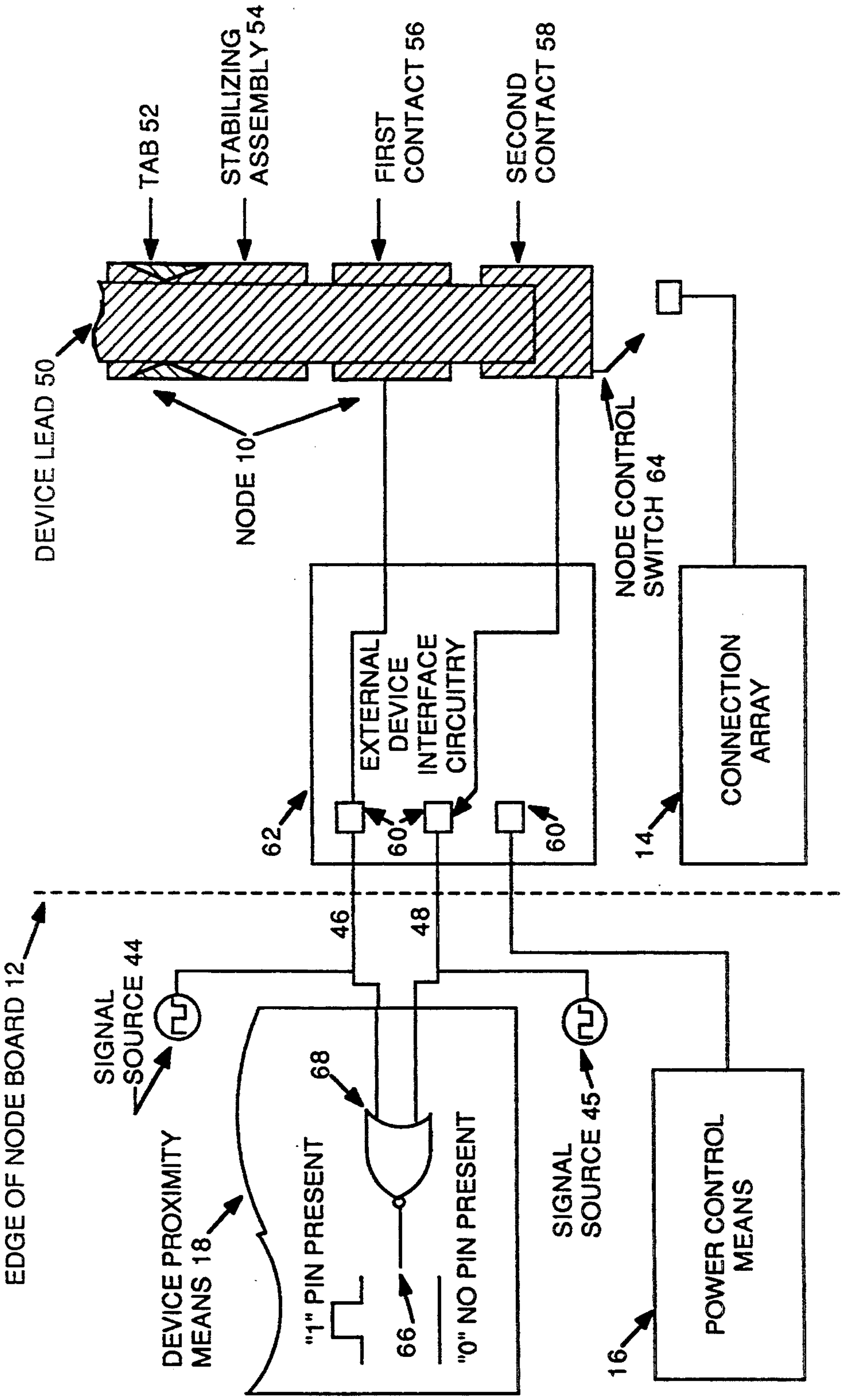
FIG. 2 is a pictorial schematic diagram of a preferred embodiment of the system circuitry at a node.
Figure 3:
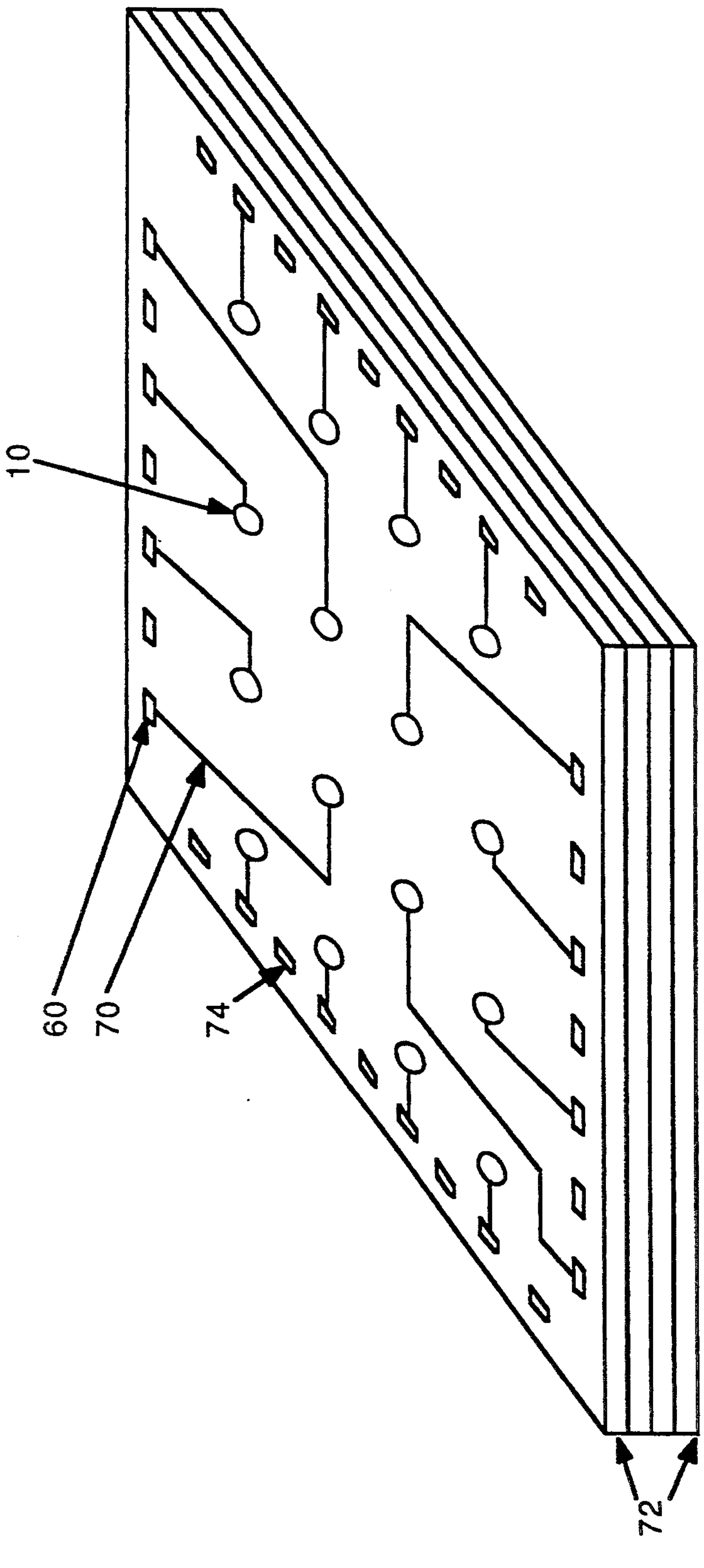
FIG. 3 is a perspective view of a preferred embodiment for the external device interface circuitry on the node board.

Referring now to FIG. 1(A), there is shown a block diagram of a preferred embodiment of the programmable interconnect system. The system includes: a connection array means 14, a device proximity means 18, a node board 12, and a power control means 16. Although FIG. 1A for simplicity shows only one node 10, it should be understood that node board 12 contains a plurality of nodes 10, as shown in FIG. 3. The pins or leads of electronic devices 22 are inserted into the nodes of node board 12 and the device proximity means 18 is used in conjunction with the computer 20 to determine where electronic devices 22 are present on the node board 12. The computer 20 uses the information about the location of the device leads 50, as shown in FIG. 2, to determine the location of the devices 22 on the node board 12 and controls the connection of power and ground to specified nodes 10 via the power control means 16. Once all connections are specified, the connection array means 14 is programmed to establish the specified connections among the nodes 10 on the node board 12.

Figure 1B:
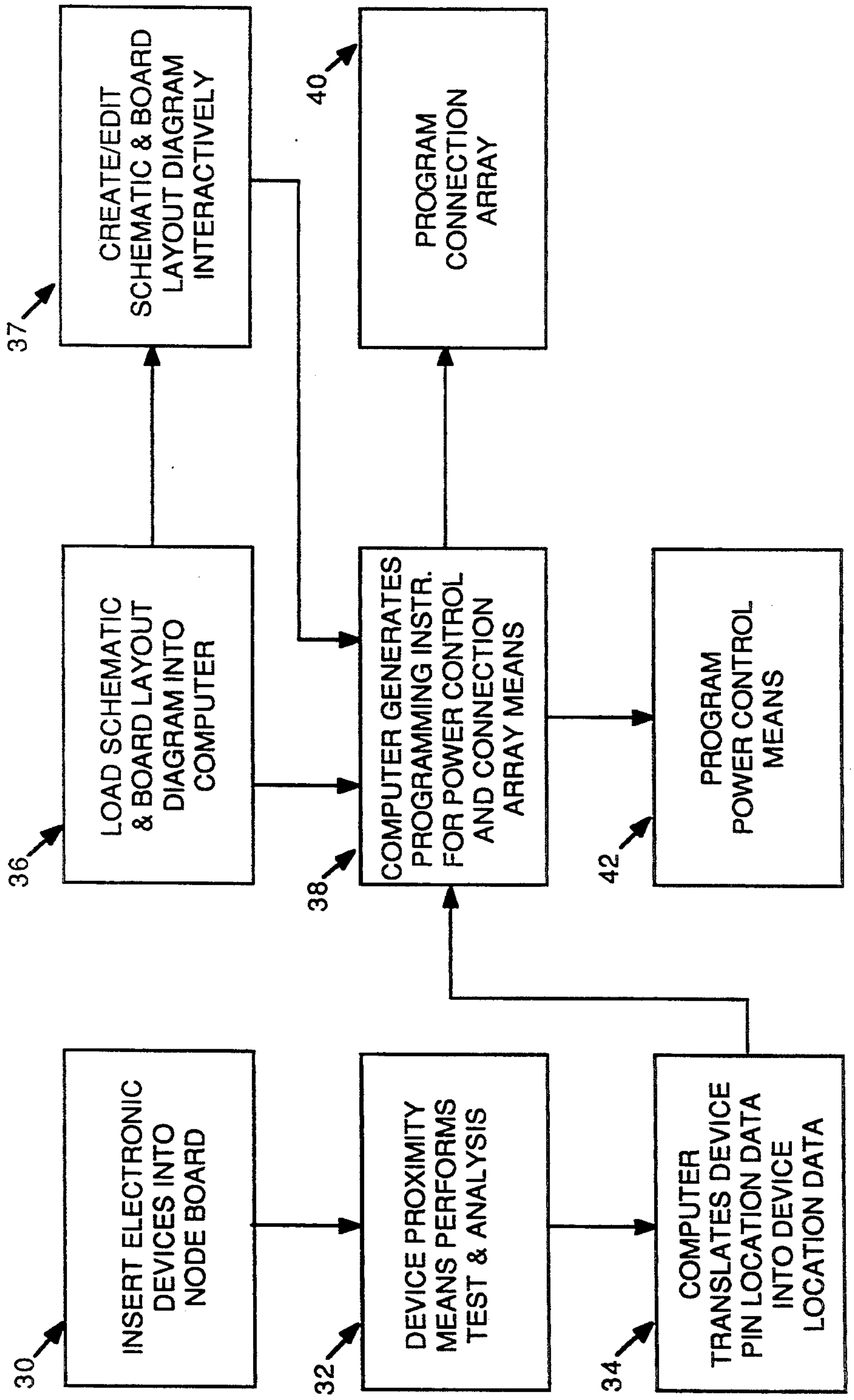
FIG. 1(B) is a flow chart illustrating the operation of the present invention.

FIG. 1(B) is a flow chart which illustrates the operation of the system. Schematic and board layout diagram data are provided to the computer 20 via diagram data providing means 35 (FIG. 1A) either by loading (FIG. 1B, 36) or by interactive creation and editing (FIG. 1B, 37), both in a conventional manner, to assemble the entire schematic on the computer 20. The board layout diagram gives the relative locations of the electronic devices 22 on the node board 12 and identifies the type of each electronic device 22. Electronic devices 22 corresponding to components in the schematic are inserted 30 into the node board 12 in the same sequence that they appear on the board layout diagram 36, 37. The device proximity means 18 performs the test 32 for device leads 50, as shown in FIG. 2, on the node board 12 and sends the device lead location data to the computer 20. The computer 20 transforms 34 the device lead location data into device location data. With the schematic 36 loaded into the computer 20, the computer uses the device location data to generate programming instructions 40, 42 for the power control means 16 and the connection array means 14 according to the schematic 36.

FIG. 2 is a pictorial schematic diagram which shows a node assembly. Each node 10 on the node board 12 serves as a socket for a pin or lead 50 of an electronic device 22 inserted into the board 12. The nodes 10 are designed to retain device pins or leads 50 that are inserted into them via resilient tabs or members 52 and conventional socket mechanisms. The retention force is derived from the application of mechanical force that results from the resilient tabs 52 in each node 10 pressing against a device lead 50 that is positioned in the node 10. A stabilizing assembly 54 is disposed below the tab 52 portion of the node 10 to maintain mechanical stability of a pin or lead 50 within the node 10.

Each node 10 is electrically independent of other nodes 10. The first electrically independent contact 56 in each node 10 is connected to the external device interface circuitry 62 that provides an electronic interface to the device proximity means 18 and power control means 16. The second electrically independent contact 58 is connected to the node control switch 64 which selectively couples the second electrically independent contact 58 to the connection array means 14. The external device interface circuity 62 couples the second electrically independent contact 58 in the node 10 to either the device proximity means 18 or the power control means 16. The device proximity means 18 scans the nodes 10 of the node board 12 and determines the location of devices 22 that have been plugged into the node board 12. The power control means 16 is then controlled by the computer 20 to distribute power or ground to the second electrically independent contact 58 in any node 10 on the node board 12.

Selected nodes 10 are electrically connected to the lead detection circuit 68 of the device proximity means 18, as illustrated in FIG. 2. The lead detection circuit 68 enables the device proximity means 18 to determine the presence of a device lead in a node 10, as previously described. If a lead is present in the node 10, a logic "1" is produced at the output 66 as will be explained herein. As shown in FIG. 2, a lead detection circuit 68 comprises a NOR gate 68 with two inputs 46, 48 and an output 66. A test signal from signal source 44 representing logic "1" is provided simultaneously to input 46 and the first of the electrically independent contacts 56 on each of the nodes 10. Logic "0" is provided simultaneously by signal source 45 to input 48 and the second of the electrical contacts 58 on the node 10. The electrical contact of the lead 50 with the two electrically independent contacts 56, 58 in the node acts as a logical AND between the two inputs 46, 48 of the NOR gate 68. Two logical "0" 's are presented to the inputs of the NOR gate 68 and a logical "1" appears at the output 66 that indicates the lead 50 is present. An absence of the lead 50 in the node 10 means there is no logical AND between inputs 46, 48 so that when input 48 is a logical "0", the input 46 remains a logical "1" and the output 66 of the NOR gate 68 is a logical "0".

The node board 12 has a plurality of nodes. The interface circuitry 70 shown in FIG. 3 facilitates the connection of individual nodes 10 to the power control means 16 or the device proximity means 18. Each layer of the multi-layer printed circuit board 72 is dedicated to routing a subset of the first 56 and second 58 electrically independent contacts in a number of nodes 10 to the periphery of the node board 12. Conductive pads 60 from the lower layers 72 may be routed to locations on the top layer of the printed circuit board in a pattern of contact locations 74 that is formed along the perimeter of the circuit board, as shown in FIG. 3.

Figure 4:
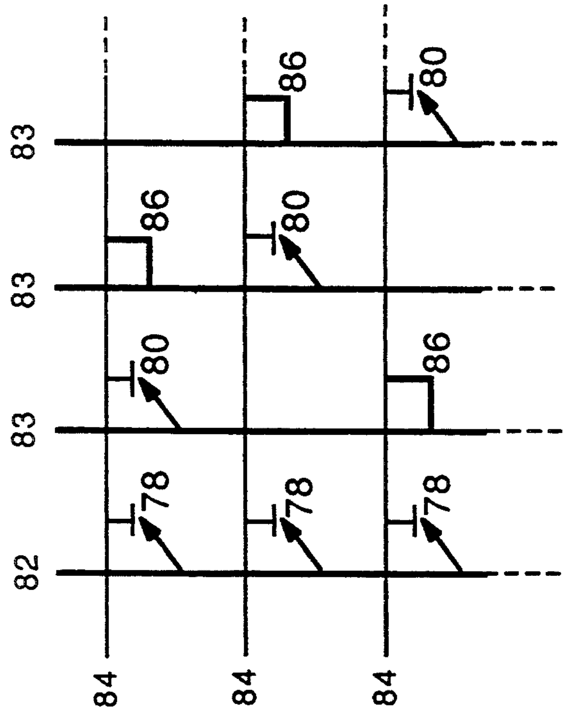
FIG. 4 is a schematic diagram of a simplified connection array means according to the present invention.

As shown in the schematic diagram of FIG. 4, the connection array means 14 includes a first plurality of switches 78, a second plurality of switches 80, a first set 82, 83 of conducting lines, and a second set 84 of conducting lines. The first set includes a first conducting line 82 and a remaining plurality of conducting lines 83. Each of the first set of the conducting lines 82, 83 is coupled to one of the second of the electrically independent contacts 58 on the node 10 by the node control switch 64, as shown in FIG. 2. Each conducting line of the remaining plurality of lines 83 of the first set 82, 83 is coupled to a respective conducting line of the second set 84. The first plurality of switches 78 couples each of the remaining plurality of conducting lines 83 of the first set 82, 83 to a respective conducting line of the second set 84. The second plurality of switches 80 couples the first conducting line 82 of the first set 82, 83 to each conducting line of the second set 84. There are $M^2$ lines in the first set 82, 83 i.e., one line 82, 83 for every one of $M^2$ nodes 10 on $M \times M$ node board 12. There are $M^2$-1 lines in the second set 84, each with two switches 78, 80. Thus, the total number of switches required to fully connect $M^2$ nodes 10 is $2M^2$-2.

Figure 5:
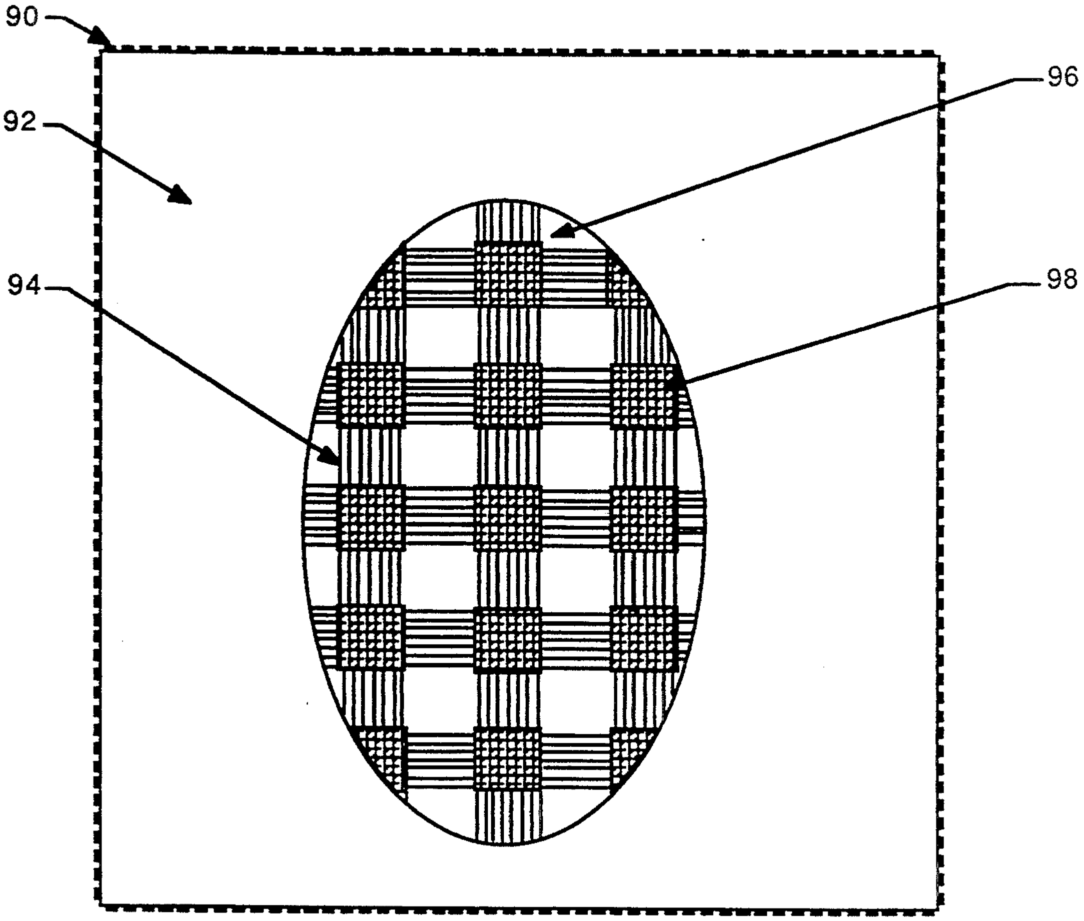
FIG. 5 is a partial top sectional view of the connection array means according to one embodiment of the present invention.

As shown in the partial top sectional view of FIG. 5, control and processing circuitry 90 is interconnected with the connection array means 14 via interconnect 92. The control and processing circuitry 90 decodes the control input received from the computer 20 and determines the configuration of the two groups of switches 78, 80 such that the connection array means 14 will yield the specified connections between nodes 10.

Figure 6:
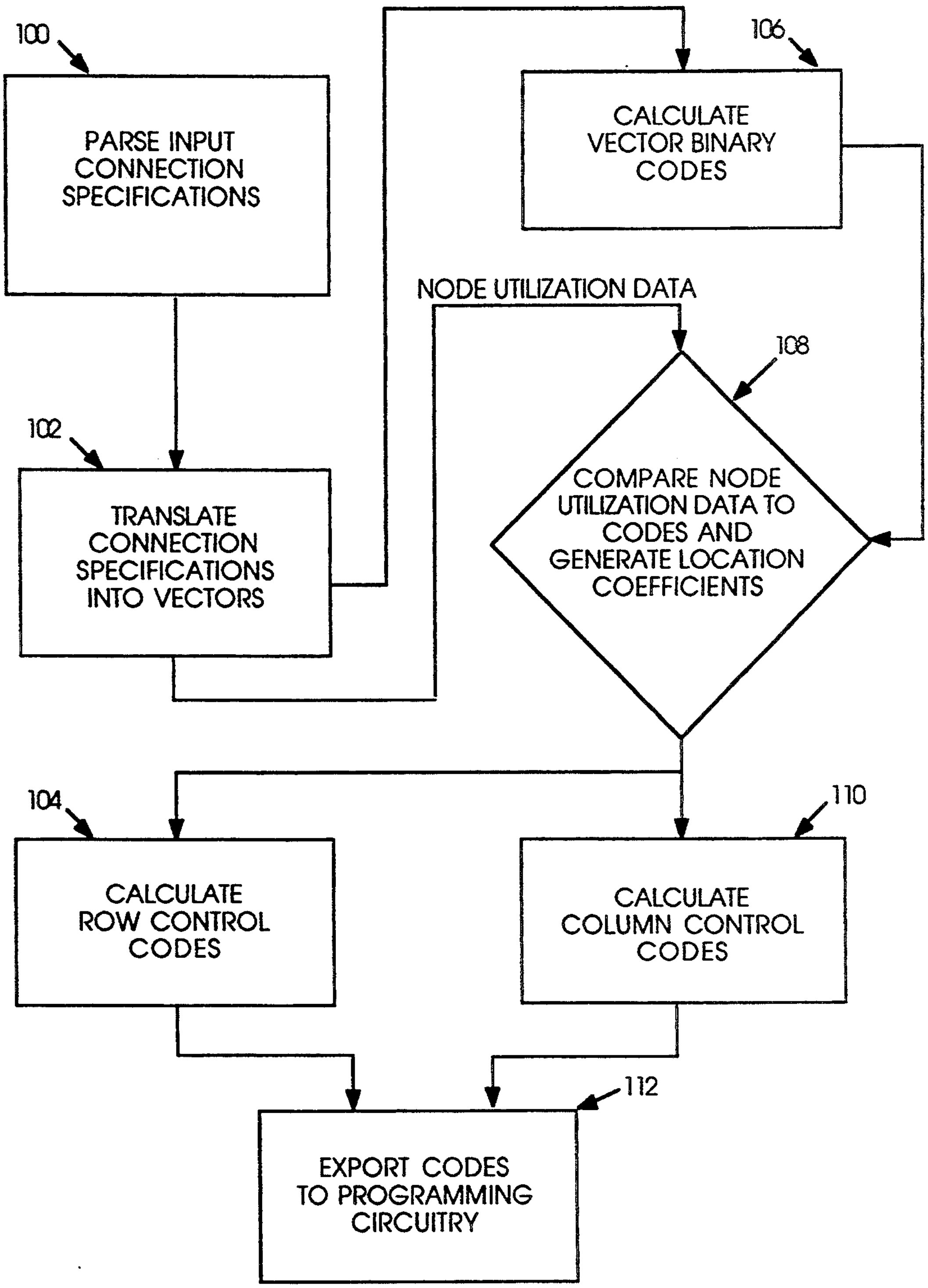
FIG. 6 is a flow chart illustrating the connection array control process.

The connection array means 14 and the computer 20 function according to the process of FIG. 6 to configure the total number of inputs, in $M^2$ factorial ways, where $M^2$ is equal to the combined total number of input and output lines utilized by each device 22 on the node board 12 that is interfaced to the connection array means 14. The control procedure of FIG. 6 for the connection array means 14 corresponds to the computer 20 generating 38 programming instructions for the connection array means 14 in FIG. 1(B). Specifically, the computer parses 100 the connection specifications from the schematic and the board layout diagram 36, 37 to provide lead 50 number and device 22 number information for each node 10. The information about the lead 50 number and device 22 number for each node 10 is then translated 102 into a set of vectors that indicate connections between specific nodes. These vectors are used to generate vector binary codes 106. The binary codes 106, which when modified to take into account the actual positions rather than the relative positions of the electronic devices 22 on the node board 12, are used to program the connection array means 14. Node utilization information 108 produced during the translation 102 of connection specifications into vectors is information derived from data provided by the device proximity means 18 that indicates where the electronic devices 22 are physically located on the node board 12. The vector binary codes are compared 108 to the node utilization information to calculate location coefficients that reflect the desired connections between device leads 50 and the physical locations of the devices 22. The location coefficients are used to calculate the row and column control codes 104, 110, and the computer 20 then uses the row and column control codes to program 112 the connection array means 14.

In order for the device proximity system to function properly, electronic devices 22 must be inserted in the node board 12 according to the following procedure: (1) the top of every device 22 must be parallel to the top of the node board 12; (2) a minimum spacing of at least one unused node 10 must be maintained between the leads of adjacent devices 22 on the node board 12; and (3) optionally, electronic devices 22 should be inserted in the same relative positions that they appear on the board layout diagram 36, 37 in the computer 20. The device proximity means 18 determines where device leads 50 are present on the node board 12 as later described herein.

Figure 7:
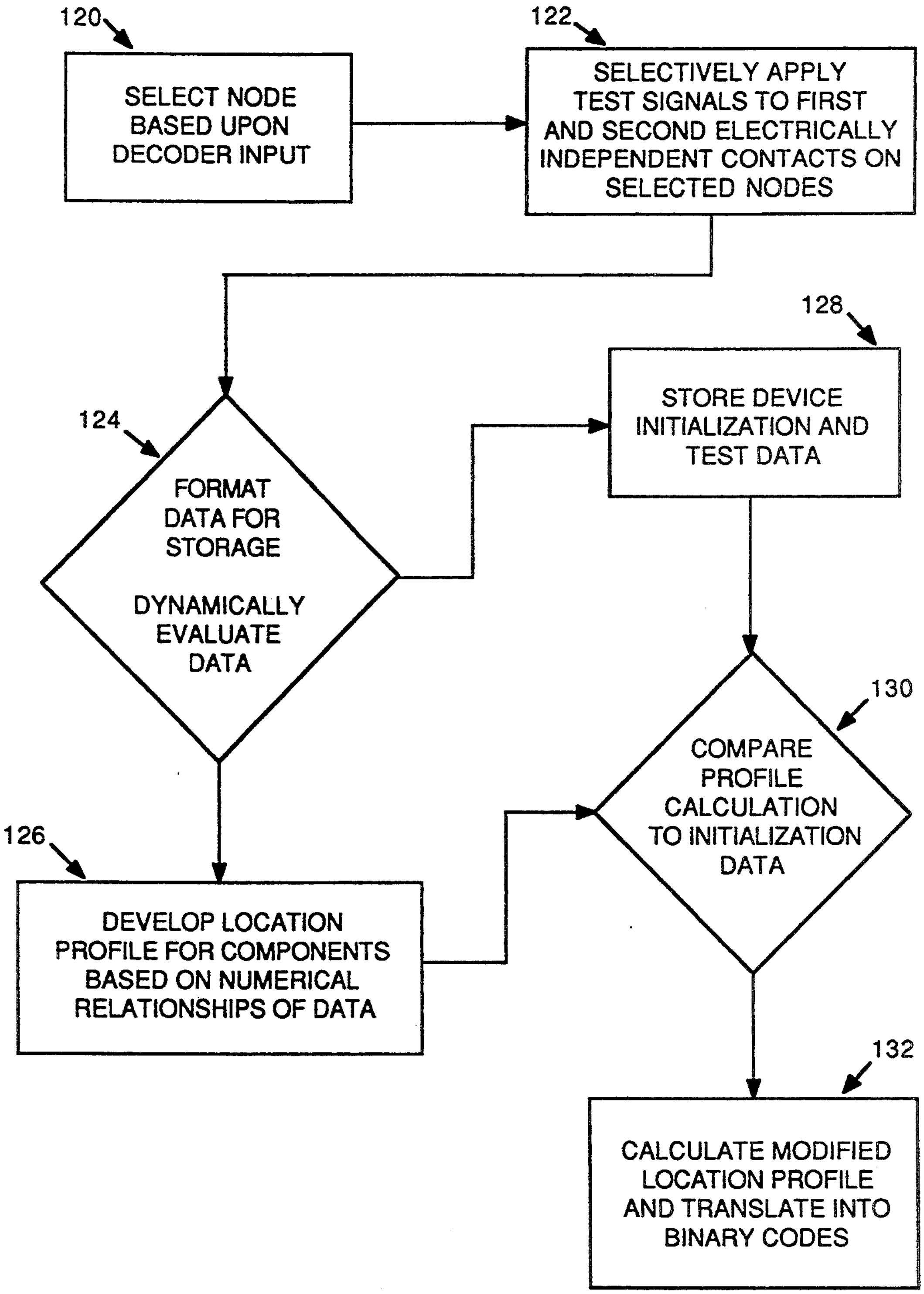
FIG. 7 is a flow chart illustrating the device proximity detection process according to a preferred embodiment of the present invention; and, FIG. 8 is a schematic diagram of the power control means switch network.

The computer 20 determines the position of the devices 22 present on the node board 12 by the process shown in FIG. 7. The device proximity means performs test and analysis 32 to identify lead 50 occupied nodes 10 based upon decoder input 120 from the computer 20 and upon selectively applied 122 test signals from signal sources 44, 45 to selected nodes. In order to determine the boundary of each device 22 on the node board 12, the system dynamically evaluates 124 the relative location of nodes 10 that, according to the node test 122, contain device leads 50. The evaluation 124 is done dynamically because device 22 locations may be changed and the current positions of devices 22 must always be known to the computer 20. The information about the boundary of each device 22 and the device initialization and test data from the dynamic evaluation step 124 is stored 128. Once the boundaries of the devices 22 are known from the dynamic evaluation 124, the computer 20 develops a location profile 126 which is a determination of how the devices 22 are positioned and connected on the node board 12 as indicated by numerical relationships between device 22 boundaries and the spaces between devices 22. The computer 20 generates a complete determination of the physical location of the devices 22 present on the node board 12 by comparing 130 the location profile to the device initialization and test data. The complete determination of the physical locations of the devices that are present on the node board is thus translated 132 into binary codes.

Figure 8:
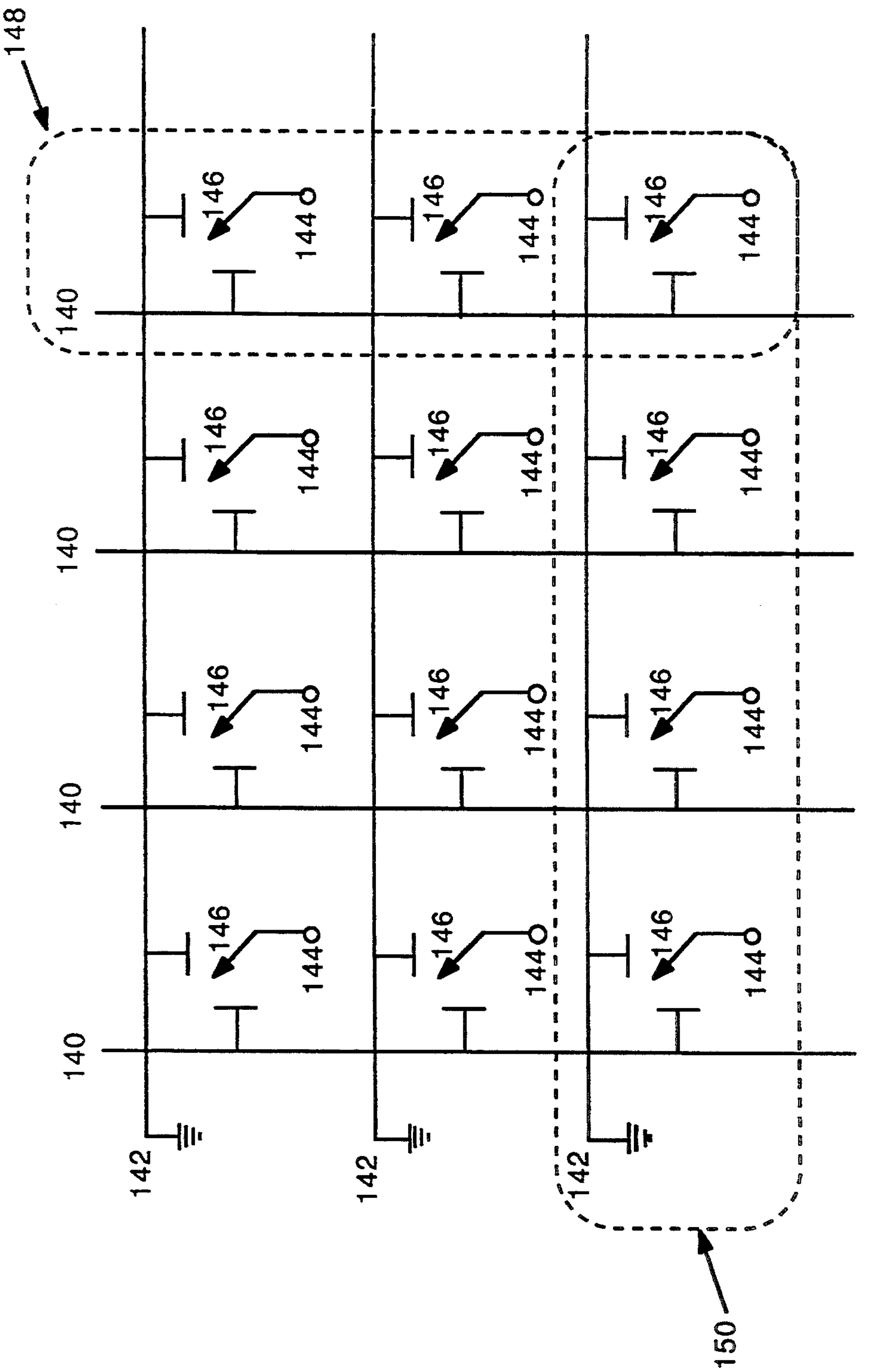

Referring now to the schematic diagram of FIG. 8, the switches 146 of the power control means 16 are operated by the computer 20 that determines which device leads 50 require power and ground on the basis of the schematic 36, 37. A power 'zone' 148 is defined as a set of contacts 144 which are coupled to the second electrically independent contact 58 on the node 10 by the external device interface circuitry 62 and to which a power source on conductor 140 within the zone is connected. Similarly, a ground 'zone' 150 is defined as a set of contacts 144 to which ground on conductor 142 within the zone is connected. This feature enables the user to group electronic devices 22 that have similar power requirements into the same zone, thereby minimizing the distance between the electronic devices 22 and their respective power sources.

Therefore, electronic devices with leads are inserted into selected nodes in a node board and make electrical and physical contact between two electrically independent contacts present in the node. The device proximity means tests for device leads inserted into the node board and the computer determines the device locations from the test results. The computer uses information about the device locations to program the power control means and the connection array means to provide power and ground to selected leads and to make connections among selected leads of devices at other nodes, according to a prototype referred to previously.

What is claimed is:

1. A system for establishing electrical connections between leads of electronic devices, said system comprising:
   - a node board comprising a plurality of nodes, each node having first and second electrical contacts between which an electrical connection is formed by an electronic device lead inserted in the node;
   - proximity detection means for testing said first and second electrical contacts of each node to detect whether an electronic device lead has been inserted therein and for producing lead location data identifying nodes having leads inserted therein;
   - connection array means including a plurality of selectively operable switches for establishing reconfigurable connections between second electrical contacts of nodes having leads therein; and
   - computer control means responsive to said lead location data for operating said connection array means switches to establish said reconfigurable connections.

2. The system of claim 1, wherein each of the nodes further comprises a tab that provides mechanical force capable of securing the device lead inserted in the node.

3. A system for establishing reconfigurable electrical connections between pins of electronic devices, said system comprising:
   - a node array comprised of a plurality of electrically conductive nodes, each configured to removably receive and electrically contact a pin of an electronic device;
   - connection array means comprising selectively operable switches for reconfigurably electrically interconnecting nodes of said node array;
   - detection means for producing pin location data indicating those nodes occupied by a pin; and
   - computer means responsive to said pin location data for selectively operating said connection array means switches to electrically interconnect pins received in said node array.

4. The system of claim 3 further including:
   - means for providing schematic and board layout diagram data; and wherein
   - said computer means is responsive to both said schematic and board layout diagram data and said pin location data for selectively operating said connection array means switches to electrically interconnect pins received in said node array.

5. The system of claim 4 further including power control means operable for selectively applying electric power to pins received in said node array; and wherein said computer means is additionally responsive to said pin location data and said schematic and board layout diagram data for operating said power control means.

6. The system of claim 4 wherein said computer means includes means for translating said pin location data into data identifying electronic devices and their location in said node array.

7. The system of claim 3 wherein each of said nodes includes first and second spaced electrical contacts arranged to be electrically connected by a pin received in that node.

8. The system of claim 7 wherein said means for producing pin location data includes proximity means for determining with respect to each node whether the first and second contacts thereof are electrically connected.

9. A system for establishing reconfigurable electrical connections between pins of electronic devices, said system comprising:

a node array comprised of a plurality of electrically conductive nodes, each configured to removably receive and electrically contact a pin of an electronic device;

connection array means comprising selectively operable switches for reconfigurably electrically interconnecting pins present in said node array;

means for providing schematic and board layout diagram data; and computer means responsive to said schematic diagram and board layout data for selectively operating said connection array means switches to electrically interconnect pins received in said node array.

10. A method for establishing reconfigurable electrical connections between pins of electronic devices comprising:

inserting electronic devices into an array of nodes with each device pin received in a different node;

testing said array of nodes to determine which nodes are occupied by device pins;

generating location data identifying nodes occupied by device pins; and responding to said location data for configuring a reconfigurable connection array to interconnect selected ones of said device pins.

11. The method of claim 10 wherein said step of configuring includes:

determining from said step of identifying occupied nodes, the identity and location of electronic devices in said array of nodes; and electronically comparing the identity and location of said electronic devices with electronically represented schematic and board layout diagram data.

12. The method of claim 11 including the further step of:

selectively applying electric power to pins received in said array of nodes.

* * * * *